United States Patent
Hiramatsu et al.

(10) Patent No.: US 9,954,135 B2
(45) Date of Patent: Apr. 24, 2018

(54) SOLAR CELL MANUFACTURING METHOD

(71) Applicants: TOSHIBA MITSUBISHI-ELECTRIC INDUSTRIAL SYSTEMS CORPORATION, Chuo-ku (JP); KYOTO UNIVERSITY, Kyoto-shi (JP); KOCHI PREFECTURAL PUBLIC UNIVERSITY CORPORATION, Kochi-shi (JP)

(72) Inventors: Takahiro Hiramatsu, Tokyo (JP); Hiroyuki Orita, Tokyo (JP); Takahiro Shirahata, Tokyo (JP); Toshiyuki Kawaharamura, Kochi (JP); Shizuo Fujita, Kyoto (JP)

(73) Assignees: Toshiba Mitsubishi-Electric Industrial Systems Corporation, Chuo-ku (JP); Kyoto University, Kyoto-shi (JP); Kochi Prefectural Public University Corporation, Kochi-shi (JP)

( * ) Notice: Subject to any disclaimer, the term of this patent is extended or adjusted under 35 U.S.C. 154(b) by 0 days.

(21) Appl. No.: 14/901,778

(22) PCT Filed: Jul. 11, 2013

(86) PCT No.: PCT/JP2013/068949
§ 371 (c)(1),
(2) Date: Dec. 29, 2015

(87) PCT Pub. No.: WO2015/004767
PCT Pub. Date: Jan. 15, 2015

(65) Prior Publication Data
US 2016/0204301 A1    Jul. 14, 2016

(51) Int. Cl.
*H01L 31/18*    (2006.01)
*H01L 31/028*   (2006.01)
*H01L 31/0216*  (2014.01)

(52) U.S. Cl.
CPC ........ *H01L 31/1868* (2013.01); *H01L 31/028* (2013.01); *H01L 31/0216* (2013.01); *Y02E 10/547* (2013.01); *Y02P 70/521* (2015.11)

(58) Field of Classification Search
CPC ............. H01L 31/1868; H01L 31/0216; H01L 31/028; H01L 31/18; C23C 8/10; C23C 8/12; C23C 4/10; C23C 4/12
See application file for complete search history.

(56) References Cited

U.S. PATENT DOCUMENTS

| | | | |
|---|---|---|---|
| 2005/0130416 A1* | 6/2005 | Fujisawa | B60R 16/0207 438/680 |
| 2012/0040083 A1* | 2/2012 | Orita | C23C 16/405 427/8 |

(Continued)

FOREIGN PATENT DOCUMENTS

| | | |
|---|---|---|
| CN | 102598303 A | 7/2012 |
| JP | 2012-33538 A | 2/2012 |

(Continued)

OTHER PUBLICATIONS

International Search Report dated Aug. 6, 2013, in PCT/JP2013/068949 filed Jul. 11, 2013.
Taiwanese Office Actions dated Jun. 22, 2015, and dated Nov. 27, 2015, in corresponding Taiwanese Application 102141218, with Partial English Translations (14 pages).

(Continued)

*Primary Examiner* — Brigitte Paterson
(74) *Attorney, Agent, or Firm* — Oblon, McClelland, Maier & Neustadt, L.L.P.

(57) ABSTRACT

A method for manufacturing solar cell includes the following. A solution containing aluminum elements is misted. The misted solution is sprayed onto the main surface of a p-type silicon substrate in the atmosphere, to thereby form an aluminum oxide film. Then, a solar cell is produced using the p-type silicon substrate including the aluminum oxide film formed thereon.

1 Claim, 1 Drawing Sheet

(56) References Cited

U.S. PATENT DOCUMENTS

| | | | |
|---|---|---|---|
| 2012/0174960 A1 | 7/2012 | Hashigami et al. | |
| 2013/0247972 A1* | 9/2013 | Mungekar | H01L 31/02167 136/256 |
| 2014/0308489 A1* | 10/2014 | Miyahira | C01G 39/00 428/206 |

FOREIGN PATENT DOCUMENTS

| | | |
|---|---|---|
| KR | 10-2012-0083400 A | 7/2012 |
| TW | 201311363 A1 | 3/2013 |
| WO | WO 2010/035313 A1 | 4/2010 |
| WO | WO 2011/033826 A1 | 3/2011 |
| WO | WO 2013/038484 A1 | 3/2013 |

OTHER PUBLICATIONS

International Preliminary Report on Patentability and Written Opinion dated Jan. 21, 2016 in PCT/JP2013/068949 (with English language translation).

Office Action dated Jul. 5, 2016 in Japanese Patent Application No. 2015-526090 (with partial English translation).

Office Action dated Dec. 1, 2016 in Taiwanese Patent Application No. 102141218 (with English Translation).

Combined Chinese Office Action and Search Report dated Aug. 1, 2016 in Patent Application No. 201380078121.1 (with Partial English language translation).

Office Action issued in Korean Application No. 10-2016-7000051 dated Jul. 31, 2017 with English Translation of Notification of Decision of Refusal.

Office Action dated Feb. 20, 2017 in Korean Patent Application No. 10-2016-7000051 (with English translation).

Office Action dated Mar. 9, 2017 in Chinese Patent Application No. 201380078121.1 (with English translation).

Office Action issued in Chinese Patent Application No. 201380078121.1 dated Jun. 7, 2017 with Partial English Translation of Decision of Refusal.

Office Action in Korean Patent Application No. 10-2016-7000051 dated May 22, 2017 with Partial English Translation.

* cited by examiner

SOLAR CELL MANUFACTURING METHOD

TECHNICAL FIELD

The present invention relates to a method for manufacturing solar cell, and more particularly, to a method for forming a passivation film on a silicon substrate.

BACKGROUND ART

In the field of crystalline silicon solar cell, silicon substrates have been reduced in thickness in order to reduce the amount of silicon usage and to improve the conversion efficiency of silicon substrates. Unfortunately, thinner silicon substrates have remarkably lower conversion efficiency. This is because, for example, a large number of defects in the front surface of the silicon substrate having a conductivity mainly cause the reduction in the lifetime of minority carriers (for example, electrons in a p-type substrate) generated by irradiation with light. Thus, reducing the loss of minority carriers eventually improves the conversion efficiency of solar cells.

To regulate the reduction in the lifetime of carries, a passivation film is generally formed on the back surface of the silicon substrate. An aluminum oxide film, one of a plurality of kinds of passivation films, has received attention as the above-described passivation film because of its higher passivation effect (the function to regulate the reduction in lifetime) on the p-type silicon substrate.

The aluminum oxide films include negative fixed charges and are known to produce the passivation effect resulting from the field effect caused by the fixed charge. Thus, the aluminum oxide film including negative fixed charges is formed on the front surface of the p-type silicon substrate to regulate the diffusion of electrons being minority carriers into the surface of the substrate, thereby preventing the loss of carriers.

The aluminum oxide film being the passivation film is formed on the p-type silicon substrate by chemical vapor deposition (CVD) (see, for example, Patent Document 1).

PRIOR ART DOCUMENT

Patent Document

Patent Document 1: Japanese Patent Application Laid-Open. No. 2012-33538

SUMMARY OF INVENTION

Problems to be Solved by the Invention

Unfortunately, forming an aluminum oxide film by CVD requires a material such as try-methyl-aluminium (TMA) that is costly and difficult to handle. According to CVD, a film forming region needs to undergo a vacuum processing, causing an increase in the cost of film formation. In the formation of aluminum oxide film by plasma CVD, the silicon substrate could be damaged by plasma.

Alternatively, an aluminum oxide film can be formed on the silicon substrate by atomic layer deposition (ALD). Unfortunately, ALD also requires TMA as well as the vacuum processing, which result in higher manufacturing cost. Moreover, significantly slow film formation by ALD could lead to poor production efficiency. The plasma-assisted ALD could conceivably be applied in order to improve the speed of film formation. Unfortunately, the silicon substrate could be damaged in the plasma-assisted ALD.

The present invention therefore has an object to provide a method for manufacturing solar cell that allows for, without inflicting damage to a silicon substrate, the formation of an aluminum oxide film being a passivation film with a high degree of production efficiency at lower manufacturing cost.

Means to Solve the Problems

To achieve the above-described object, a method for manufacturing solar cell according to the present invention includes the steps of (A) preparing a silicon substrate of p-type conductivity, (B) forming a passivation film on a main surface of the silicon substrate, and (C) producing a solar cell using the silicon substrate including the passivation film formed thereon. The step (B) includes the steps of (B-1) misting a solution containing aluminum elements and (B-2) spraying the misted solution onto the main surface of the silicon substrate in the atmosphere to form the passivation film being an aluminum oxide film.

Effects of the Invention

The method for manufacturing solar cell according to the present invention includes the steps (A) preparing the silicon substrate of p-type conductivity, (B) forming the passivation film on the main surface of the silicon substrate, and (C) producing the solar cell using the silicon substrate including the passivation film formed thereon. The step (B) includes the steps of (B-1) misting the solution containing aluminum elements and (B-2) spraying the misted solution onto the main surface of the silicon substrate in the atmosphere to form the passivation film being an aluminum oxide film.

This allows for the formation of a back surface passivation film made of the aluminum oxide film on the p-type silicon substrate through the use of a material that is inexpensive and easy to handle. The method eliminates the need for, for example, a vacuum processing, thus enabling the reduction of manufacturing cost. The film forming processing does not inflict damage to the p-type silicon substrate. The method also achieves the improvement of production efficiency.

These and other objects, features, aspects and advantages of the present invention will become more apparent from the following detailed description of the present invention when taken in conjunction with the accompanying drawings.

DESCRIPTION OF EMBODIMENTS

Figure 1:
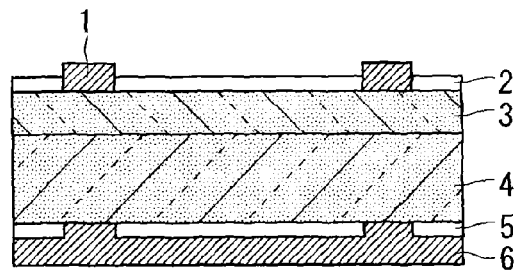
FIG. 1 A cross-sectional view of a configuration of a solar cell.

FIG. 1 is a cross-sectional view of a basic configuration of a solar cell.

As shown in FIG. 1, a silicon layer 3 (hereinafter referred to as n-type silicon layer 3) of n-type conductivity is formed in the upper surface (the front surface) of a silicon substrate 4 (hereinafter referred to as p-type silicon substrate 4) of p-type conductivity. A front surface passivation film (such as a silicon oxide film or a silicon nitride film) 2 being transparent is formed on the upper surface (the front surface) of the n-type silicon layer 3. A front surface electrode 1 connected to the n-type silicon layer 3 is formed in the front surface passivation film 2.

A back surface passivation film 5 is formed on the lower surface (the back surface) of the p-type silicon substrate 4. An aluminum oxide film (AlOx) is used as the back surface passivation film 5. A back surface electrode 6 connected to the p-type silicon substrate 4 is formed on the back surface passivation film 5.

In the solar cell shown in FIG. 1, light incident from the front-surface-passivation-film-2 side reaches a p-n junction between the silicon substrate layer 3 and the silicon substrate 4 (the n-type silicon layer 3 and the p-type silicon substrate 4) to generate carriers, so that electricity is produced, and then, the produced electricity is extracted through the electrodes 1 and 6.

As described above, the passivation films 2 and 5 are formed to regulate the reduction in the lifetime of carriers. A large number of defects (such as lattice defects) occur in the main surfaces of the silicon layer 3 and the silicon substrate 4, and thus, minority carriers generated by irradiation with light are recombined by the defects. The passivation films 2 and 5 are formed on the main surfaces of the silicon layer 3 and the silicon substrate 4 to regulate the recombination of carriers, whereby the lifetime of carriers can be improved.

The present invention relates to a method for forming an aluminum oxide film 5 as a back surface passivation film 5 on the p-type silicon substrate 4. The following describes the present invention in detail with reference to the drawings illustrating the embodiments thereof.

Embodiment 1

Figure 2:
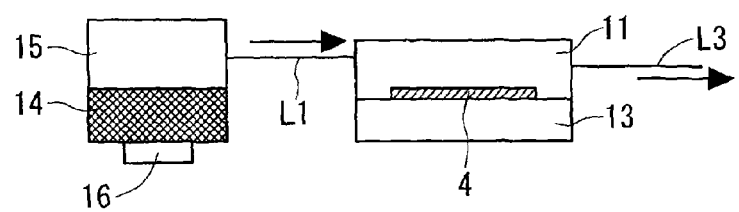
FIG. 2 A view of a configuration of a film forming apparatus for implementing a film forming method according to an embodiment 1.

FIG. 2 is a view of a schematic configuration of a film forming apparatus capable of implementing the method for forming the aluminum oxide film 5 according to the present embodiment.

As shown in FIG. 2, the film forming apparatus includes a reactor 11, a heater 13, a solution container 15, and a mist forming apparatus 16.

In the film forming apparatus, a given solution 14 that has been misted is sprayed onto the back surface of the p-type silicon substrate 4, whereby the aluminum oxide film 5 is formed on the back surface of the p-type silicon substrate 4.

While the p-type silicon substrate 4 is placed on the heater 13, mist (the aqueous solution 14 having a small particle diameter) is supplied into the reactor 11 in the atmosphere, and then, the aluminum oxide film 5 is formed on the back surface of the p-type silicon substrate 4 as a result of a given reaction. Note that the front surface of the p-type silicon substrate 4 is placed on the heater 13.

The heater 13 being, for example, a heating apparatus can heat the p-type silicon substrate 4 placed on the heater 13. In the formation of film, the heater 13 is heated to a temperature required to form the aluminum oxide film 5 through an external controller.

The solution container 15 is filled with the row material solution (hereinafter referred to as solution) 14 for forming the aluminum oxide film 5. The solution 14 contains aluminum (Al) elements as the metal source.

For example, an ultrasonic atomizing apparatus can be used as the mist forming apparatus 16. The mist forming apparatus 16 being the ultrasonic atomizing apparatus applies ultrasonic waves to the solution 14 in the solution container 15, thereby misting the solution 14 in the solution container 15. The misted solution 14 passes through a channel L1 to be supplied to the back surface of the p-type silicon substrate 4 in the reactor 11.

The misted solution 14 is supplied into the reactor 11, and then, the solution 14 undergoes a reaction on the p-type silicon substrate 4 subjected to heating in the atmosphere, whereby the aluminum oxide film 5 is formed on the back surface of the p-type silicon substrate 4. The solution 14 that is left unreacted in the reactor 11 is discharged out of the reactor 11 all the time (in a continuous manner) through a channel L3.

The following describes a method for forming the back surface passivation film 5 (the aluminum oxide film 5) according to the present embodiment.

Firstly, a given impurity is introduced to a silicon substrate to produce a silicon substrate (the p-type silicon substrate 4) of p-type conductivity. Then, the p-type silicon substrate 4 is placed on the heater 13 in the reactor 11. At this time, the placement surface is the front surface of the p-type silicon substrate 4 and the inside of the reactor 11 is at atmospheric pressure.

The heater 13 heats the p-type silicon substrate 4 placed on the heater 13 to a film formation temperature at which the aluminum oxide film 5 is to be formed. The p-type silicon substrate 4 is kept at the film formation temperature.

Meanwhile, in the solution container 15, the solution 14 is misted by the mist forming apparatus 16. The misted solution 14 (the solution 14 having a small particle diameter) passes through the channel L1, undergoes the flow alignment, and is supplied into the reactor 11. The solution 14 contains aluminum as the metal source.

The misted solution 14 having undergone the flow alignment is supplied to the back surface of the p-type silicon substrate 4 under application of heat in the atmosphere. The misted solution 14 is sprayed onto the p-type silicon substrate 4 under application of heat, and then, the aluminum oxide film 5 is formed on the back surface of the p-type silicon substrate 4.

After that, the solar cell having the configuration shown in FIG. 1 is produced using the p-type silicon substrate 4 including the back surface passivation film 5 (the aluminum oxide film 5) formed thereon. In general, the back surface passivation film 5 is formed after the formation of the n-type silicon layer 3.

As described above, the method for forming the back surface passivation film 5 (the aluminum oxide film 5) according to the present embodiment employs the misting method (the method for forming a film by spraying the aqueous solution 14 in the atmosphere) to form the aluminum oxide film 5 on the back surface of the p-type silicon substrate 4.

The aluminum oxide film 5 is formed by supplying the vaporized raw material to the p-type silicon substrate 4 in, for example, CVD or ALD. Alternatively, in the present invention, the aluminum oxide film 5 is formed by spraying the misted aqueous solution 14 onto the p-type silicon substrate 4. As described above, the solution 14 contains aluminum elements. Thus, the back surface passivation film 5 made of an aluminum oxide film can be formed on the p-type silicon substrate 4, using a material that is inexpensive and easy to handle instead of using a material such as TMA that is expensive and difficult to handle.

The present invention, which is the film forming processing in the atmosphere, eliminates the need for the vacuum processing and the like, thus enabling the reduction of manufacturing cost. According to the present invention, the misted solution 14 is sprayed onto the p-type silicon substrate 4 to perform the film forming processing. Thus, in the film forming processing, the p-type silicon substrate 4 is not damaged by irradiation with, for example, plasma.

The aluminum oxide film 5 is formed by the misting method at a speed of 10 to 15 nm/min, which is five or more times as fast as the speed at which the aluminum oxide film is formed by, for example, ALD. Thus, the employment of the film forming method according to the present invention can also improve the production efficiency.

Embodiment 2

The inventors vigorously performed a number of different experiments, analyses, and the like, thus successfully finding the method for forming the aluminum oxide film 5 that significantly improves the lifetime of carriers. That is, the inventors have successfully found film forming conditions for increasing the passivation effects of the aluminum oxide film 5. The following describes the film forming method.

Figure 3:
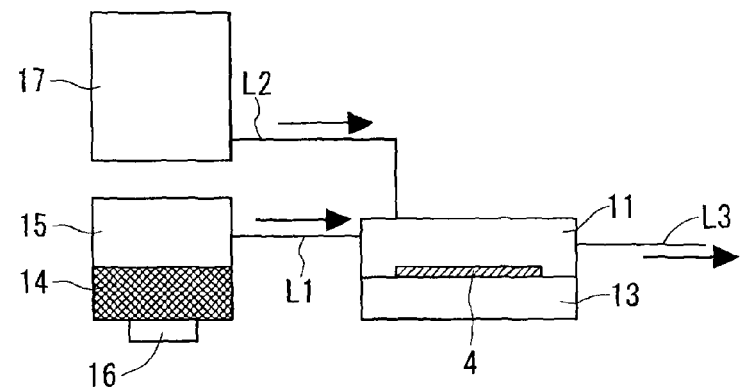
FIG. 3 A view of a configuration of a film forming apparatus for implementing a film forming method according to an embodiment 2.

FIG. 3 is a view of a schematic configuration of a film forming apparatus capable of implementing the method for forming the aluminum oxide film 5 according to the present embodiment.

As is clear from the comparison between FIG. 2 and FIG. 3, the film forming apparatus according to the present embodiment has the configuration in FIG. 2 and additionally includes an ozone generator 17. The following describes the part distinct from the configuration in FIG. 2.

The ozone generator 17 is capable of generating ozone. For example, in the ozone generator 17, a high voltage is applied between the parallel electrodes disposed in parallel and oxygen is passed between the electrodes to decompose oxygen molecules, which then recombine with other oxygen molecules to generate ozone.

As shown in FIG. 3, the ozone generator 17 and the reactor 11 are connected to each other through a channel L2 that is separate from the channel L1. Thus, ozone generated by the ozone generator 17 passes through the channel L2 to be supplied to the back surface of the p-type silicon substrate 4 in the reactor 11.

The configuration except for the details described above is the same as the configuration described in the embodiment 1, and the description of the same configuration is omitted.

The method for forming the back surface passivation film 5 (the aluminum oxide film 5) according to the present embodiment is given below.

The p-type silicon substrate 4 is placed on the heater 13 in the reactor 11 at atmospheric pressure. The p-type silicon substrate 4 placed on the heater 13 is heated to a film formation temperature (for example, about 360° C.) at which the aluminum oxide film 5 is to be formed and the p-type silicon substrate 4 is kept at the film formation temperature.

Meanwhile, in the solution container 15, the solution 14 is misted by the mist forming apparatus 16. The misted solution 14 (the aqueous solution 14 having a small particle diameter) passes through the channel L1, undergoes the flow alignment, and is supplied into the reactor 11. The solution 14 contains aluminum elements as the metal source. For example, the methanol solution containing aluminum acetylacetonate dissolved therein can be used as the solution 14. In the present embodiment, ozone is generated by the ozone generator 17 and the generated ozone passes through the channel L2 to be supplied into the reactor 11.

The misted solution 14 having undergone the flow alignment is sprayed onto the back surface of the p-type silicon substrate 4 under application of heat in the atmosphere, and then, ozone is supplied, so that the aluminum oxide film 5 is formed on the back surface of the p-type silicon substrate 4. The solution 14 and ozone that are left unreacted in the reactor 11 are discharged out of the reactor 11 all the time (in a continuous manner) through the channel L3.

Then, the solar cell having the configuration shown in FIG. 1 is produced using the p-type silicon substrate 4 including the back surface passivation film 5 (the aluminum oxide film 5) formed thereon.

As described above, in the method for forming the back surface passivation film 5 (the aluminum oxide film 5) according to the present embodiment, the solution 14 is sprayed in the reactor 11 by the misting method, and then, ozone is supplied into the reactor 11, so that the aluminum oxide film 5 is formed on the back surface of the p-type silicon substrate 4.

Thus, the solar cell produced by the film forming method described in the present embodiment offers increased improvement in the lifetime of carriers as compared with the solar cell produced by the film forming method described in the embodiment 1. That is, the addition of ozone gas in the formation of the aluminum oxide film 5 can increase the passivation effect of the aluminum oxide film 5.

The p-type silicon substrate 4 was produced through the use of the float zone (FZ) technology. The p-type silicon substrate 4 had a resistivity of 3 Ω-cm. The p-type silicon substrate 4 had a thickness of 280 μm.

The film forming method according to the embodiment 1 was implemented on one p-type silicon substrate 4, thereby forming an aluminum oxide film ($Al_2O_3$) having a film thickness of 60 nm on the one p-type silicon substrate 4. The film forming method according to the embodiment 2 was implemented on another p-type silicon substrate 4, thereby forming an aluminum oxide film ($Al_2O_3$) having a film thickness of 60 nm on the other p-type silicon substrate 4. Both of these film forming methods had the same film forming conditions except for the presence or absence of ozone supply.

Then, the microwave photo conductivity decay (μ-PCD) method was implemented on the one p-type silicon substrate 4 including $Al_2O_3$ formed thereon and the other p-type silicon substrate 4 including $Al_2O_3$ formed thereon, to thereby measure the lifetime of carriers.

Consequently, the lifetime of carries in the other p-type silicon substrate 4 was found to be five or more times as long as the lifetime of carries in the one p-type silicon substrate 4. In other words, the significant improvement in the lifetime of carriers resulting from the ozone supply in the formation of the aluminum oxide film 5 was experimentally verified.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 4 p-type silicon substrate
5 back surface passivation film (aluminum oxide film)
11 reactor
13 heater
14 (raw material) solution

15 solution container
16 mist forming apparatus
17 ozone generator
L1, L2, L3 channel

The invention claimed is:

1. A method for manufacturing solar cell, comprising:
   (A) preparing a silicon substrate of p-type conductivity;
   (B) forming an aluminum oxide passivation film on a main surface of said silicon substrate by spraying a misted solution containing aluminum elements onto said main surface of said silicon substrate at atmospheric pressure while supplying ozone to said silicon substrate; and
   (C) producing a solar cell using said silicon substrate including said passivation film formed thereon,
   wherein said misted solution is obtained by applying ultrasonic waves to a solution containing aluminum elements.

* * * * *